(12) United States Patent
Suganuma et al.

(10) Patent No.: US 6,972,417 B2
(45) Date of Patent: Dec. 6, 2005

(54) APPARATUS AND METHODS FOR PATTERNING A RETICLE BLANK BY ELECTRON-BEAM INSCRIPTION WITH REDUCED EXPOSURE OF THE RETICLE BLANK BY BACKSCATTERED ELECTRONS

(75) Inventors: Wakako Suganuma, Tokyo (JP); Sumito Shimizu, Kyoto (JP); Atsushi Yamada, Yokohama (JP); Shohei Suzuki, Fukaya (JP); Hajime Yamamoto, Kumagaya (JP)

(73) Assignee: Nikon Corporation, Tokyo (JP)

( * ) Notice: Subject to any disclaimer, the term of this patent is extended or adjusted under 35 U.S.C. 154(b) by 420 days.

(21) Appl. No.: 09/908,628

(22) Filed: Jul. 18, 2001

(65) Prior Publication Data

US 2002/0012853 A1    Jan. 31, 2002

(30) Foreign Application Priority Data

Jul. 19, 2000 (JP) .............................. 2000-219133
Jul. 25, 2000 (JP) .............................. 2000-223597
May 18, 2001 (JP) .............................. 2001-148877

(51) Int. Cl.$^7$ .......................... G01B 11/26; H01J 37/00
(52) U.S. Cl. .............................. 250/492.1; 250/440.11; 250/442.11; 250/492.2; 250/492.22
(58) Field of Search .................... 250/396 ML, 492.1, 250/492.3, 492.2, 440.11, 442.11, 492.22

(56) References Cited

U.S. PATENT DOCUMENTS

| 5,635,719 | A | * | 6/1997 | Petric ............... 250/396 ML |
| 5,757,010 | A | * | 5/1998 | Langner ............ 250/396 ML |
| 6,118,129 | A | * | 9/2000 | Oae et al. ........... 250/492.22 |
| 6,521,901 | B1 | * | 2/2003 | Shamoun et al. ..... 250/492.2 |

FOREIGN PATENT DOCUMENTS

JP          02-170410          7/1990

* cited by examiner

*Primary Examiner*—John R. Lee
*Assistant Examiner*—Paul M. Gurzo
(74) *Attorney, Agent, or Firm*—Klarquist Sparkman, LLP

(57) ABSTRACT

Apparatus and methods are disclosed for inscribing a pattern on a reticle blank to produce a lithography reticle. As a reticle blank is inscribed using a charged particle beam (e.g., electron beam), some of the incident charged particles pass through the reticle blank and are backscattered from underlying structure (e.g., from a stage used to hold the reticle blank during inscription). These backscattered particles reduce the pattern resolution on the reticle. The present apparatus and methods reduce the number of backscattered particles re-entering the reticle blank, thereby improving pattern resolution.

17 Claims, 6 Drawing Sheets

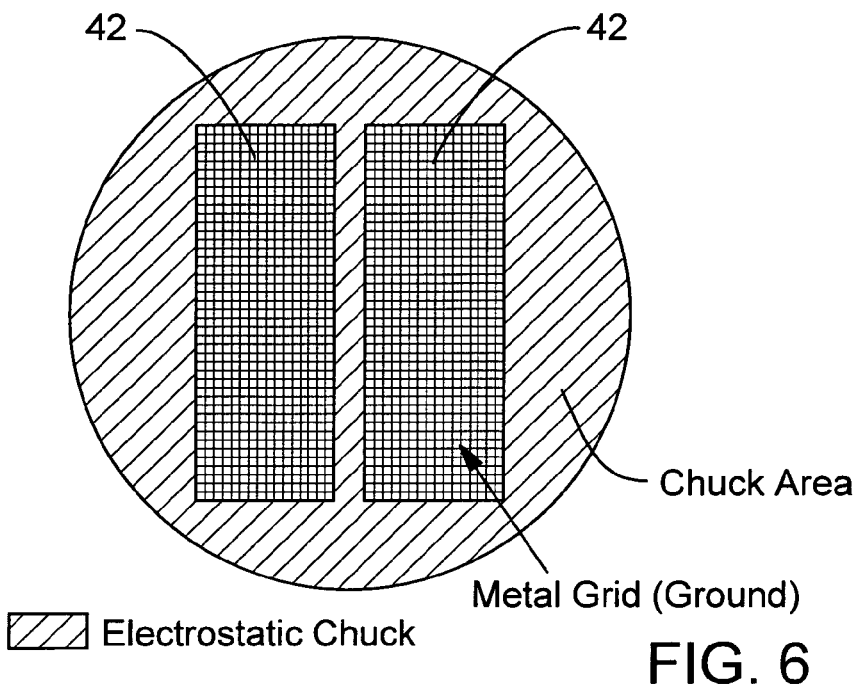
FIG. 6
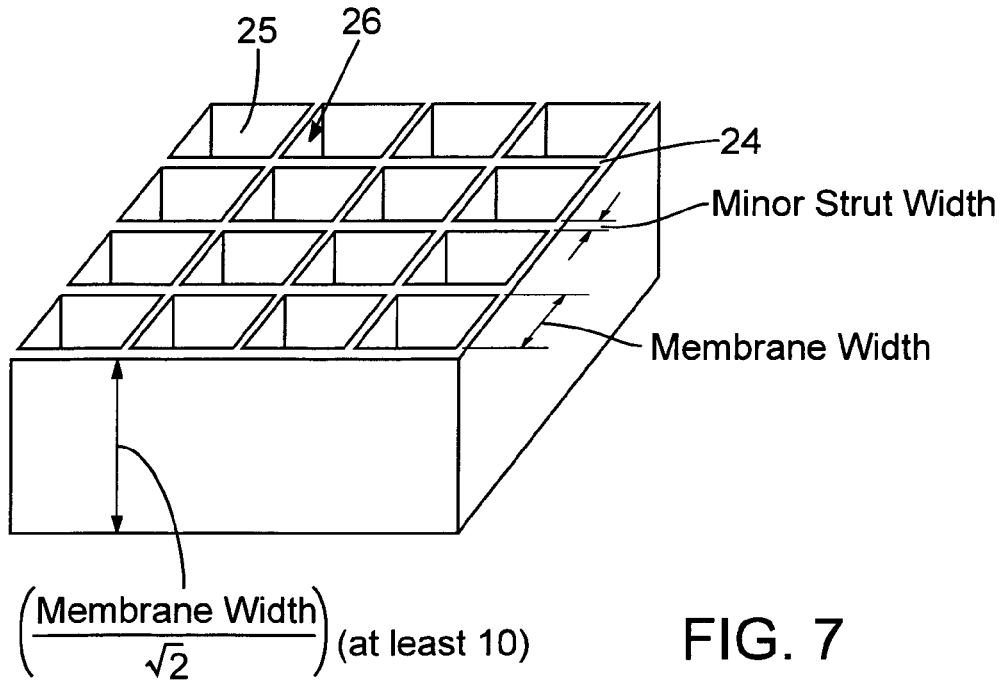
$\left(\dfrac{\text{Membrane Width}}{\sqrt{2}}\right)$ (at least 10)    FIG. 7

APPARATUS AND METHODS FOR PATTERNING A RETICLE BLANK BY ELECTRON-BEAM INSCRIPTION WITH REDUCED EXPOSURE OF THE RETICLE BLANK BY BACKSCATTERED ELECTRONS

TECHNICAL FIELD

This disclosure pertains to microlithography, which involves the transfer of a pattern from a reticle or mask to a "sensitive" substrate. Microlithography is a key technology used in the manufacture of microelectronic devices such as semiconductor integrated circuits, displays, thin-film heads, micromachines, and the like. More specifically, the disclosure pertains to the manufacture of reticles and masks (generally termed "reticles" herein) for use in microlithography performed using a charged particle beam such as an electron beam.

BACKGROUND

In recent years, the progressive miniaturization of microelectronic devices has occurred concurrently with the development of microlithography apparatus that use progressively shorter wavelengths of exposure energy to obtain greater resolution of transferred patterns. In view of the fact that currently achievable lithographic resolution using vacuum ultraviolet wavelengths of light is limited by the diffraction limit of the light, an intensive development effort now is being made to produce the "next-generation" microlithography technology. An important contender is microlithography performed using a charged particle beam such as an ion beam or electron beam. Charged-particle-beam (CPB) microlithography offers prospects of substantially greater pattern-transfer resolution for reasons similar to the reasons for which electron microscopy achieves better resolution than optical microscopy.

An advantage of CPB microlithography is that it exhibits less of the image blurring normally accompanying the diffraction phenomenon of light. Currently, electron-beam "direct-write" microlithography apparatus (that imprint a pattern on a substrate without projection from a reticle), are being used for making reticles that, in turn, are used in optical and CPB projection microlithography. Direct-write electron-beam microlithography offers the potential of forming patterns having minute elements that are too small to be formed by optical microlithography, including optical microlithography performed using vacuum-ultraviolet wavelengths of light. However, a disadvantage of direct-write electron-beam microlithography is that the currently achievable throughput is low. Hence, this technique mainly is used for making reticles.

To improve the throughput of CPB microlithography, considerable development effort is being directed to CPB "projection" microlithography, wherein a pattern-defining reticle is produced in advance and used to define the pattern that is projected (usually with demagnification) from the reticle onto a substrate.

Whereas projection optical microlithography currently is the most widely used pattern-transfer technology for making microelectronic devices, limited success has been achieved to date in electron-beam projection lithography (EPL). In conventional EPL systems, the pattern as defined on the reticle is divided into multiple subregions (often termed "subfields") that are projected one at a time onto the substrate. Such a reticle is termed a "divided" or "segmented" reticle. CPB optical systems have been developed that can project, per "shot," a subregion area of 0.25 mm square on the substrate, for example. This area is considerably larger than the conventional area of about 5 $\mu$m square achieved using, for example, a variable-shaped spot beam.

Exemplary types of segmented reticles used in CPB microlithography are depicted in FIGS. 8(A)–8(C). A first type of reticle is a "scattering-stencil" reticle 20 as shown in FIG. 8(A), comprising a silicon (Si) membrane 21 having a thickness of several micrometers. To support the membrane 21, the reticle 20 includes an integral grid of support struts 14 (see FIG. 8(C) showing the grid). Each support strut has a thickness (dimension "a") of about 1 mm. The grid of support struts 14 divides the reticle 20 into multiple subregions (subfields) 21a each defining a respective portion of the pattern. In each subfield 21a, the respective membrane 21 will transmit incident charged particles, but with substantial scattering of the particles as they pass through the membrane. In each subfield 21a, respective pattern elements are defined by corresponding through-holes 22 in the respective membrane 21.

Scattering-stencil reticles used for ion-projection lithography (IPL) have a structure substantially the same as scattering-stencil reticles for EPL, except that the membrane 21 has a slightly greater thickness (e.g., approximately 3 $\mu$m).

A second type of segmented reticle is a "scattering-membrane" reticle 10 as shown in FIG. 8(B), comprising a membrane 11 of, e.g., $SiN_x$ or SiC having a thickness from several tens of nm to about 0.1 $\mu$m, as described in Japan Kôkai Patent Document No. Hei 2-170410. Scattering-membrane reticles are used, for example, in the well-known SCALPEL microlithography method. Such a membrane is transmissive to incident charged particles, with little to no scattering of particles as they pass through the membrane. To support the membrane 11, the reticle 10 includes an integral grid of support struts 14 (see FIG. 8(C) showing the grid). Each support strut has a thickness (dimension "a") of about 1 mm. The grid of support struts 14 divides the reticle 10 into multiple subregions (subfields) 11a each defining a respective portion of the pattern. The size of the subregions 11a ("c" and "d" dimensions in FIG. 8(C)) is about 1 mm on each side. Pattern elements are defined by corresponding "scattering bodies" 12 formed from a layer of CPB-scattering material (e.g., tungsten, gold, silver, or tantalum, about 0.2 $\mu$m thick) formed on the surface of the membrane 11. Over the regions of the struts 14 are regions 13 of the scattering material. Another (very recent) configuration of a scattering-membrane reticle comprises a layer of a CPB-scattering material (e.g., Si) disposed on an extremely thin (several tens of nm thick) CPB-transmissive membrane of "diamond-like carbon" (DLC).

A persistent problem in CPB projection microlithography is the task of fabricating reticles that define the respective pattern with sufficiently high accuracy. FIG. 9 depicts a conventional reticle-fabrication apparatus. An electron gun 51 produces a beam 1 of electrons that is deflected, condensed, and irradiated by an electron-optical system 52 onto a reticle blank RB. The reticle blank RB comprises a membrane 4 and a layer 5 of a resist on the upstream-facing surface of the membrane 4. In addition to the grid of support struts described above (grid not shown in FIG. 9), the reticle blank RB also includes a peripheral support ("frame") 3 that strengthens the reticle blank RB and facilitates holding of the reticle blank by a stage 2. The reticle blank RB is held by the stage 2 either mechanically or by electrostatic attraction. (The depicted stage has an upper portion 2U that mechanically secures the reticle blank RB to a lower portion 2L of the stage 2. The upper portion 2U can be eliminated by configuring the stage 2 to hold the reticle blank RB by electrostatic attraction.) The stage 2 is operable to move the reticle blank RB as required during formation of the pattern on the reticle blank. The pattern irradiated onto the reticle blank RB is configured in advance, and the beam 1 moves according to the pattern to "write" the pattern on the resist 5. After irradiation of the reticle blank RB is complete, the resist 5 is developed to imprint the image. Using the developed resist as a mask, the reticle blank RB is etched to form the pattern on the reticle.

The present inventors attempted to fabricate a reticle according to the protocol set forth in JP Kôkai Patent Document No. Hei 2-170410. A layer of a resist was coated onto the upstream-facing surface of a reticle blank as described above. The reticle blank was exposed using an electron beam accelerated to 50 kV and focused as a "spot beam" to a diameter of several nm to write the pattern directly. Using this protocol, it was not possible to achieve satisfactory formation of resolved pattern elements having a minimum linewidth of 120 nm or less. For comparison, the same resist was coated onto a silicon wafer and the wafer was exposed by electron-beam microlithography using an electron beam accelerated to 50 kV and focused as a "spot beam" having the identical diameter as used to expose the reticle blank. In contrast to the reticle blank, a 70-nm line spacing was achieved with good resolution on the silicon wafer. These results indicated that problems are inherent in conventional reticle-fabrication procedures that prevent the attainment of pattern-element resolution even as good as achievable in a corresponding microlithography procedure performed on a silicon substrate.

SUMMARY

In view of the shortcomings of conventional apparatus and methods as summarized above, an object of the claims is, inter alia, to provide reticle-fabrication apparatus and methods that achieve improved resolution of pattern elements than achievable using conventional apparatus and methods.

To such end, electron-beam writing apparatus are provided for writing a pattern on a reticle blank to produce a reticle as used for performing lithography. An embodiment of such an apparatus comprises an electron-beam source, an electron-optical system, a stage, and a means for reducing either electron backscattering from downstream structure (e.g., the stage) to the reticle blank or for reducing backscattered-electron exposure of a layer of resist on the surface of the reticle blank. The electron-beam source is configured to produce an electron beam that propagates downstream of the source. The electron-optical system is situated and configured to condense and irradiate the electron beam onto a resist-covered reticle blank and to write the pattern in the resist on the reticle blank. The stage is situated and configured to hold the reticle blank as the reticle blank is being exposed by the electron beam. The stated means is configured to reduce either backscattering of electrons, transmitted through the reticle blank, from the stage (or other structure downstream of the reticle blank) to the reticle blank or to reduce exposure of the resist caused by backscattered electrons.

By way of example, the stated means can comprise an electron trap situated downstream of the stage and configured to trap electrons transmitted through the reticle blank and backscattered from the trap or other downstream structure.

By way of a second example, the stated means can comprise an electron-absorbing plate situated downstream of the stage. The plate is made of an electron-absorbing material and has a thickness appropriate for trapping and absorbing electrons from the reticle blank that are incident on the plate. As a representative specific example, the plate can comprise a material including carbon, having a density of at least 1.7 g/cm$^3$, and a thickness of at least 0.1 mm.

By way of yet another example, the stated means can comprise a through-hole defined by a portion of the stage situated downstream of the reticle blank. The through-hole has a diameter and length sufficient to transmit electrons that have passed through the reticle blank. This configuration can further comprise, as part of the stated means, an electron-absorbing plate situated downstream of the through-hole. The electron-absorbing plate desirably is made of an electron-absorbing material and desirably has a thickness appropriate for trapping and absorbing electrons from the reticle blank that are incident on the plate.

By way of yet another example, the stated means can comprise a layer of an electrically insulative material situated downstream of the stage. This layer is configured and dimensioned to trap secondary electrons produced by electrons backscattered from material situated downstream of the layer.

According to another embodiment, the stated means can comprise features from at least one of the example embodiments summarized above.

Yet another embodiment of an electron-beam writing apparatus comprises an electron-beam source and electron-optical system as summarized above. The apparatus also includes a stage situated and configured to hold the reticle blank as the reticle blank is being exposed by the electron beam. The stage comprises a metal surface (desirably non-magnetic) defining multiple micro-recesses divided from one another by a grid of struts. By making the metal surface non-magnetic, it generates no magnetic fields that otherwise would exert undesirable effects during electron-beam inscription of the pattern on the reticle blank. The micro-recesses are configured to capture electrons transmitted through the reticle blank and entering the micro-recesses. Most of the electrons backscattered within the micro-recesses never reach the reticle blank. Thus, fogging exposure of the reticle blank is reduced substantially, allowing more minute pattern elements to be defined on the reticle. Also, the effects of linearity between CD (critical dimension) and the dose amount are improved, thus simplifying CD control.

Desirably, the micro-recesses collectively have an area, opening toward the reticle blank, of at least 90% of the entire gridded structure of the reticle blank. With such a configuration, almost all of the electrons that have passed through the reticle blank enter the micro-recesses where, as noted above, most of the electrons are not backscattered toward the reticle blank.

Each micro-recess desirably has a depth that is at least 10 times a radius of a circle circumscribed by the micro-recess facing the reticle blank. Such depths improve the reliability of capture of backscattered electrons.

Also provided are methods for producing a lithography reticle. According to an embodiment of such a method, a reticle blank is provided. A resist layer is applied to the reticle blank. A pattern is written on the resist layer using an apparatus such as any of those summarized above. The resist is developed and undeveloped portions of the resist are removed. The reticle blank is etched according to a pattern defined in the remaining developed resist. Then, the remaining resist is stripped.

The foregoing and additional features and advantages of the invention will be more readily apparent from the following detailed description, which proceeds with reference to the accompanying drawings.

BRIEF DESCRIPTION OF THE DRAWINGS

FIG. 6 is a schematic plan view of the surface of the chuck used to hold the reticle blank in an electron-beam writing apparatus according to the fifth representative embodiment.

FIG. 7 is an oblique view showing certain details of a portion of the metal grid of the embodiment shown in FIG. 6.

DETAILED DESCRIPTION

General Considerations

Figure 9:
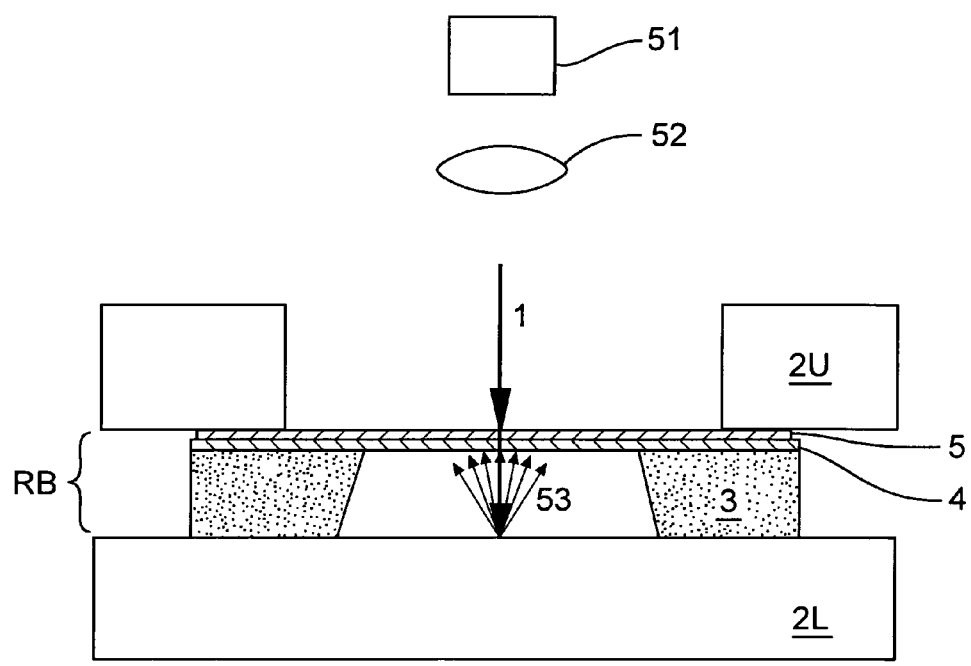
FIG. 9 is a schematic elevational view of a conventional electron-beam writing apparatus.

This invention is based in part on results of studies of problems associated with conventional reticle-fabrication methods and apparatus, as noted above. Such studies revealed that almost all electrons in a 50-kV electron beam pass through a scattering-stencil reticle for electron-beam projection lithography (EPL), especially a reticle having a membrane thickness of approximately 2 $\mu$m. (The percentage of electrons passing through the membrane is a function of the acceleration voltage of the beam.) But, as shown in FIG. 9, electrons that have passed through the membrane 4 are backscattered by the surface of the downstream portion 2L of the stage 2 (the surface of the stage 2 usually is made of metal or other electron-scattering material). These backscattered electrons 53 re-enter the membrane 4. With the surface of the member 2L being made of metal, more than 50% of the incident electrons backscattered. As a result of backscattering, the electrons re-entering the resist layer 5 have a substantially wider angular distribution than electrons of the beam 1 directly incident on the reticle blank RB. This wider angular distribution results in background exposure of the resist 5 in regions where exposure is not desired, resulting in "fogging" (formation of exposure penumbras around intended pattern elements). Fogging causes loss in pattern resolution on the finished reticle.

If the item holding the reticle blank RB is an electrostatic chuck, then the wafer-mounting surface of the chuck typically is made of a suitable dielectric material (e.g., titanium oxide or aluminum oxide) rather than metal. However, suitable dielectrics also cause substantial backscattering of incident electrons, which (similar to the situation involving a metal surface) re-enter the reticle blank and cause fogging exposure.

Figure 1A:
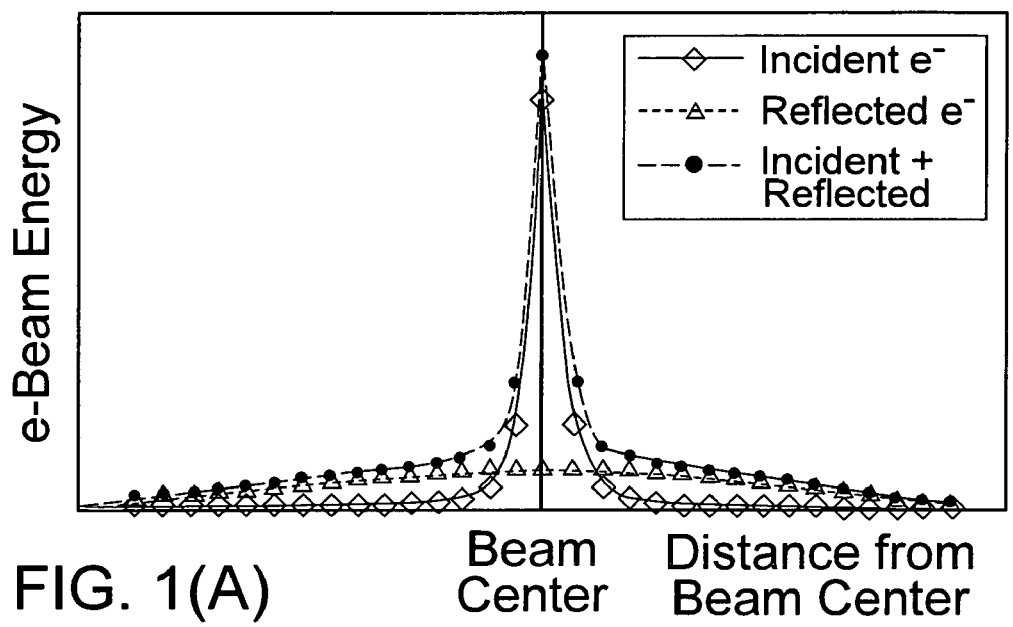
FIG. 1(A) provides plots of respective distributions of electron-beam energy, including the distribution of electron-beam energy on the resist of a reticle blank during the process of fabricating a reticle from the reticle blank using a conventional electron-beam writing method.

A representative distribution of electron-beam energy in the resist is shown in FIG. 1($a$). As can be discerned in the plots, the best positional resolution is achieved by directly incident electrons (see plot connecting the diamonds). The backscattered electrons, upon re-entering the resist, have a very broad positional distribution (see plot connecting the triangles) compared to the directly incident electrons. The summed data yield a plot (see plot connecting the solid circles) that is broader than the plot of directly incident electrons, and including a higher "noise" level. Thus, backscattered electrons re-entering the membrane considerably reduce the contrast and the resolution of the directly written image.

The inventors also found that, whenever a resist-coated substrate (e.g., silicon wafer) is exposed directly to an incident electron beam (accelerated, for example, to 50 kV) in the manner of electron-beam microlithography, approximately 20 to 30% of the directly incident electrons are backscattered from the substrate. These backscattered electrons participate in at least partial exposure of respective regions surrounding pattern elements. But, whenever a resist that has been coated onto a reticle blank is exposed to an incident electron beam of the same energy, approximately 50% of the incident electron energy (50 kV) is backscattered from the surface of the stage to the resist. The resulting fogging exposure affects pattern resolution on the reticle.

Certain aspects of the invention are directed to, inter alia, reducing these backscattered electrons and controlling their adverse effects during reticle manufacture.

The invention is described in the context of representative embodiments, which are not intended to be limiting in any way.

First Representative Embodiment

Figure 2:
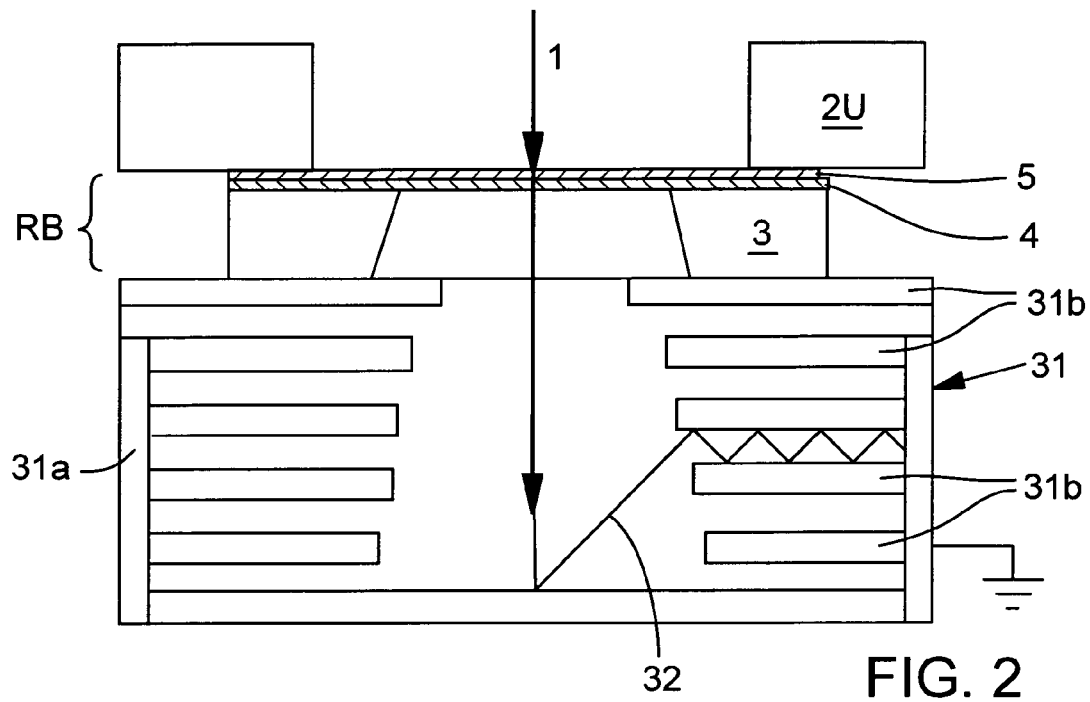
FIG. 2 is a schematic elevational view of an electron-beam writing apparatus according to the first representative embodiment.

This embodiment is depicted in FIG. 2, in which components that are similar to those discussed above in connection with FIG. 9 have the same respective reference numerals. According to this embodiment, an electron trap 31 is provided downstream of the reticle blank RB, and an upper portion 2U of the stage secures the reticle blank RB to the electron trap 31. The electron trap 31 comprises a housing 31$a$ containing multiple concentric electron-absorbing members 31$b$ spaced apart from one another. The housing 31$a$, typically made of a suitable metal, is electrically grounded. Electrons that have passed through the reticle blank RB enter the electron trap 31 and are backscattered from the bottom of the housing 31$a$ (an example trajectory is that indicated by the reference numeral 32). Electrons backscattered at a significant angle (trajectory 32) from the incident trajectory enter a space between two adjacent electron-absorbing members 31$b$. By substantially reducing the distribution angle of backscattered electrons re-entering the resist 5 from below, this device substantially reduces the size of the exposure penumbra around directly exposed regions in the resist 5.

As an electron trap, the apparatus shown in FIG. 2 can be made, by creating an electric field within the electron trap 31, to lock up completely the electron beam entering the trap. This can be done by applying a voltage to specific elements in the electron trap 31 in the manner of a Faraday cup. The apparatus also can be configured to indicate electron-reflection behavior (e.g., backscattered electrons along the trajectory 32 not returning to the membrane 4). These additional features can be provided separately or in combination. Electron trapping also can be performed by employing a trajectory-altering magnetic field.

Second Representative Embodiment

Figure 3:
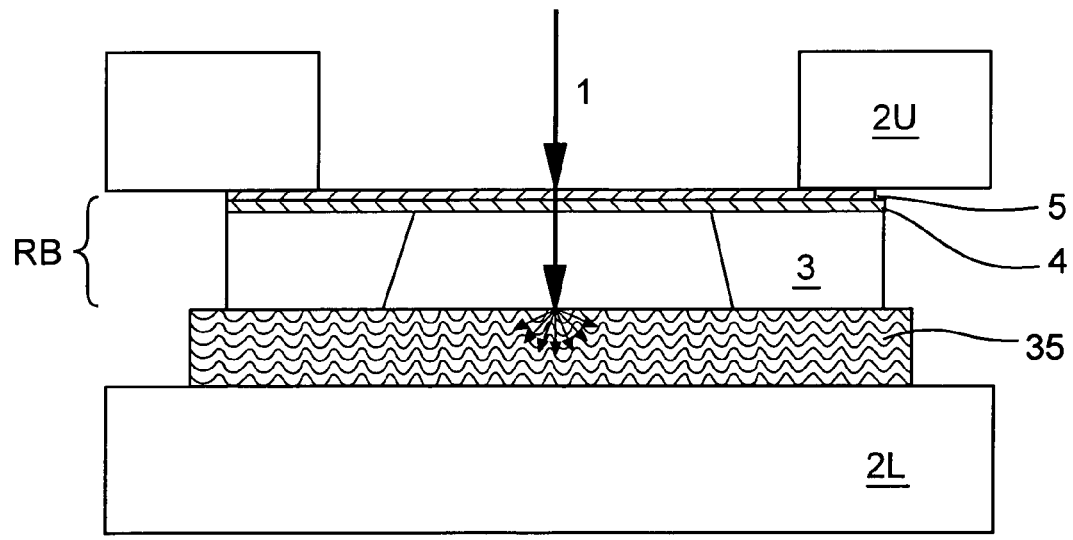
FIG. 3 is a schematic elevational view of an electron-beam writing apparatus according to the second representative embodiment.

This embodiment is depicted in FIG. 3, in which components that are similar to those discussed above in connection with FIG. 9 have the same respective reference numerals. According to this embodiment a plate 35, made of an electron-absorbing material, is situated between the reticle blank RB and the lower portion 2L of the stage 2. The electron-absorbing material of which the plate 35 is made can be a so-called "light element" that is electrically conductive and that absorbs incident electrons.

The plate 35 desirably is 0.1 mm or more thick and is a material that can be planarized to a desired flatness. An especially desirable material is carbon or a material containing substantial amounts of carbon. For example, an especially desirable material is graphite or a material produced by mixing an organic resin with graphite powder, followed by sintering. Graphite is desirable also because it exhibits minimal outgassing in a vacuum, which is important because the reticle-fabrication processes employing an electron beam are performed in a vacuum environment.

In any event, since incident electrons 1 are absorbed by the plate 35, backscattering of electrons that have passed through the membrane 4 is reduced substantially.

Third Representative Embodiment

Figure 4:
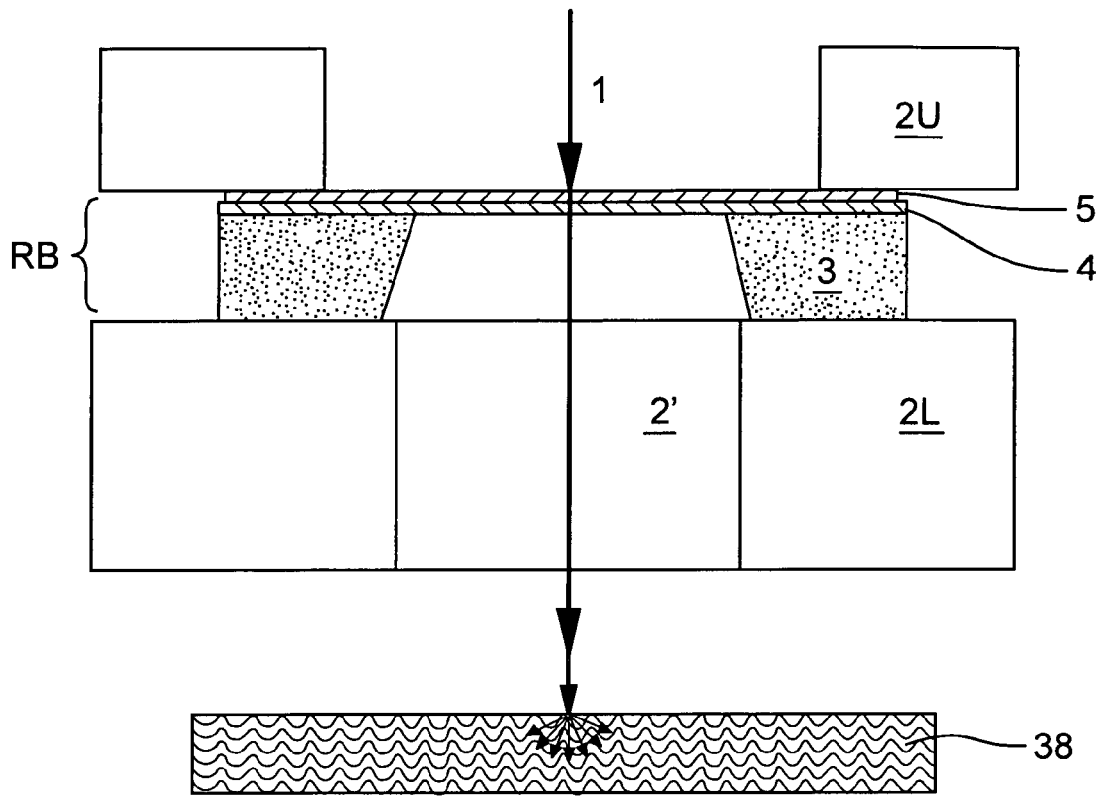
FIG. 4 is a schematic elevational view of an electron-beam writing apparatus according to the third representative embodiment.

This embodiment is depicted in FIG. 4, in which components that are similar to those discussed above in connection with FIG. 9 have the same respective reference numerals. According to this embodiment the lower portion 2L of the stage 2 defines a through-hole 2' directly below the reticle blank RB. A plate 38 of an electron-absorbing material is situated downstream of the lower portion 2L of the stage 2. The plate 38 can be configured similarly to the plate 35 used in the second representative embodiment.

This embodiment allows the reticle blank RB to be held directly between the upper portion 2U and lower portion 2L of the stage 2. Also, backscattered electrons are reduced substantially by placing the plate 38 farther from the reticle blank RB than in the second representative embodiment. It is possible to reduce backscattered electrons substantially to zero by placing another plate of an electron-absorbing material at the lower portion of the through-hole 2' so as to extend across the hole (this alternative configuration is not shown in FIG. 4, but is readily understood in the context of this and the second representative embodiment). The plate 38 can be eliminated if, in FIG. 4, the distance from the reticle blank RB to the location at which the plate 38 otherwise would be placed can be made sufficiently long to prevent most backscattered electrons from returning through the through-hole 2' to the reticle blank RB.

Fourth Representative Embodiment

Figure 1B:
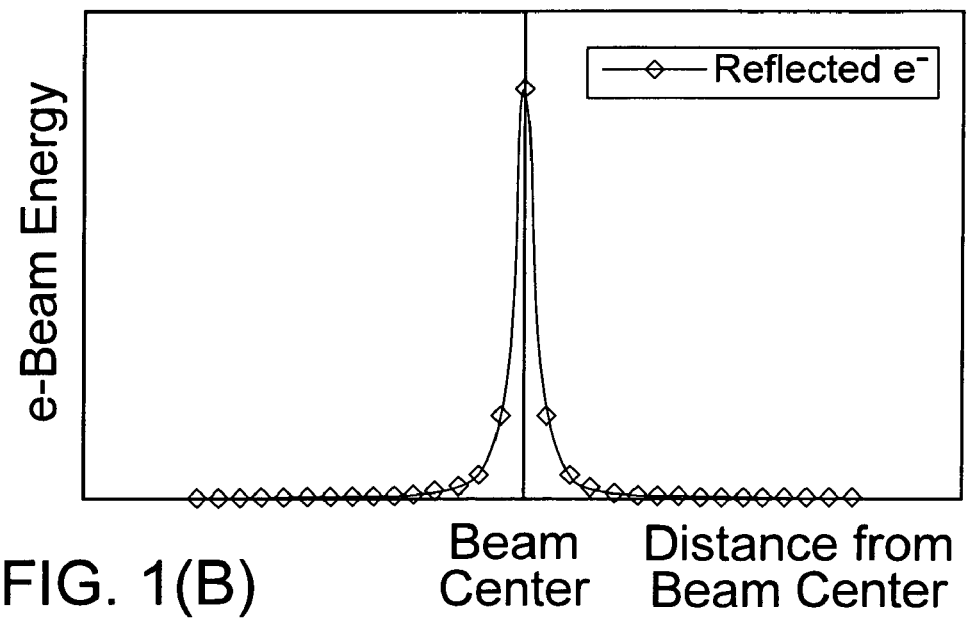
FIG. 1(B) is a plot of the distribution of electron-beam energy on the resist of a reticle blank during a process, according to the invention, of fabricating a reticle from the reticle blank by electron-beam writing.
Figure 5:
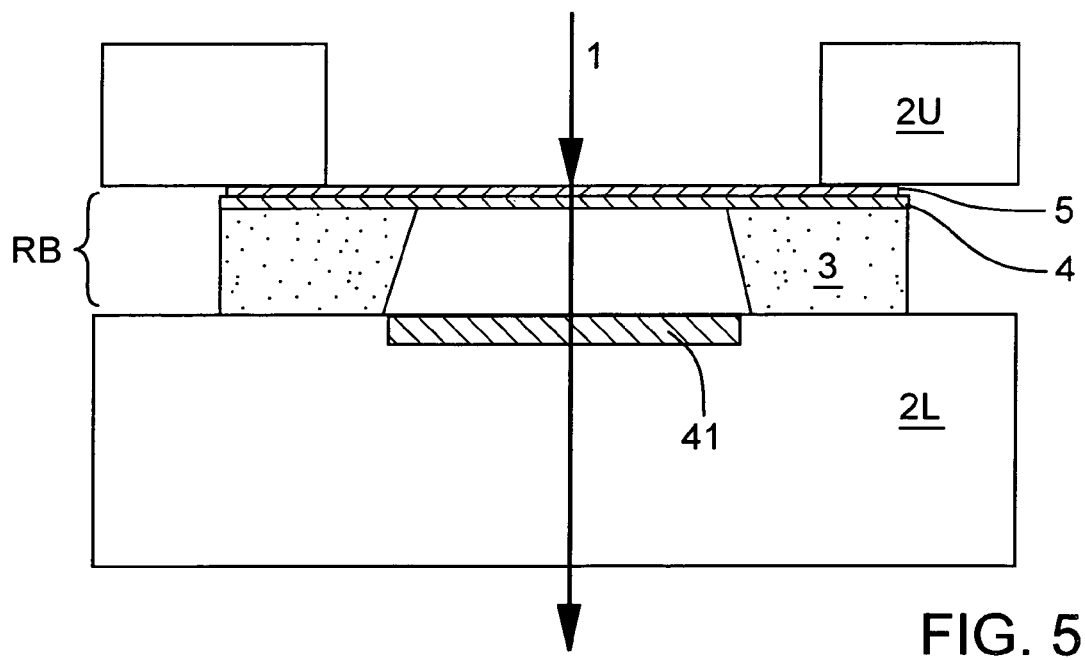
FIG. 5 is a schematic elevational view of an electron-beam writing apparatus according to the fourth representative embodiment.

This embodiment is depicted in FIG. 5, in which components that are similar to those discussed above in connection with FIG. 9 have the same respective reference numerals. According to this embodiment a layer 41 of an electrically insulative material is disposed in the vicinity of the surface of the lower portion 2L of the stage 2. Electrons that have experienced relatively low acceleration are trapped by the insulative layer 41. Thus, the insulative layer 41 effectively controls secondary-electron constituents of electrons backscattered from the lower portion 2L. Consequently, the amount of backscattered electrons from the lower portion 2L is effectively reduced. The distribution of electron energy on the resist, as obtained using any of the first through fourth representative embodiments, is depicted in FIG. 1(B). By comparing FIGS. 1(A) and 1(B), it can be ascertained readily that, with any of these representative embodiments, backscattering and its effects are greatly reduced.

EXAMPLE

This example is directed to the manufacture of a reticle using the apparatus shown in FIG. 3 (second representative embodiment).

In the apparatus, the plate 35 was made of carbon graphite as a representative "light element." The reticle blank RB was a Si membrane (2 μm thick) doped with thermally diffused boron to adjust the intrinsic stress of the reticle blank. The pattern (suitable for a reticle for EPL) was written on the reticle blank using an electron beam subjected to an acceleration voltage of 50 kV. The resist was "ZEP520" manufactured by Zeon (Japan) and formed as a layer on the upstream-facing surface of the membrane of the reticle blank. After exposure, the resist was developed, and the reticle blank was etched using the developed resist as a mask. After etching, residual resist was removed by $O_2$ ashing. The resulting reticle was examined and compared with, as a comparison example, a reticle having the same pattern but fabricated using a conventional apparatus. The pattern had elements measuring 0.2 μm or less.

In the comparison example, "critical dimension" (CD) control, in which correlations of design linewidth and actual CD linewidths vary with changes in exposure dose, could not be performed. Also, no resolution could be obtained of pattern elements sized at 0.1 μm or less. In addition, fogging exposure resulted from backscattered electrons produced by the conventional apparatus. Fogging occurred even at doses as low as 10% of the incident energy at the resist pattern.

In the reticle according to this example, in contrast, it was possible to execute good CD control for elements sized at 0.1 μm and less, and good resolution was obtained for pattern elements sized at approximately 80 nm. Also, the optimal exposure dose was approximately 10% higher than the optimal exposure dose using the conventional apparatus.

Fifth Representative Embodiment

A plan view of the structure of the upper surface of the stage, according to this embodiment, used to hold the reticle blank, is shown in FIG. 6. The depicted surface is of an electrostatic chuck that holds the reticle blank by electrostatic attraction. The surface includes zones 42 of microrecesses collectively forming a metal grid 26 (that is electrically grounded during use).

Figure 8A:
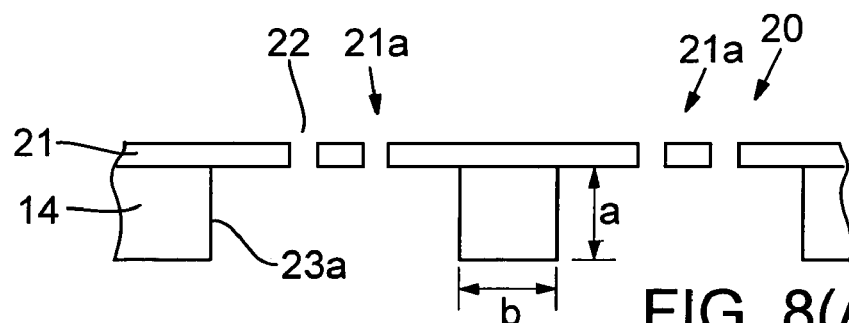
FIG. 8(A) is a schematic elevational section of a portion of a conventional segmented scattering-stencil reticle.
Figure 8B:
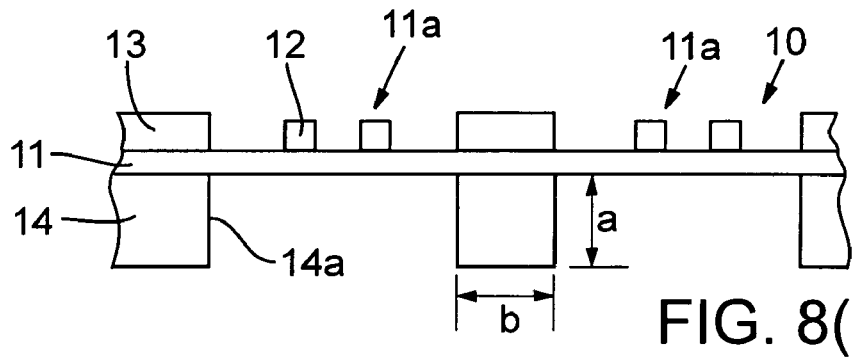
FIG. 8(B) is a schematic elevational section of a portion of a conventional segmented scattering-membrane reticle.
Figure 8C:
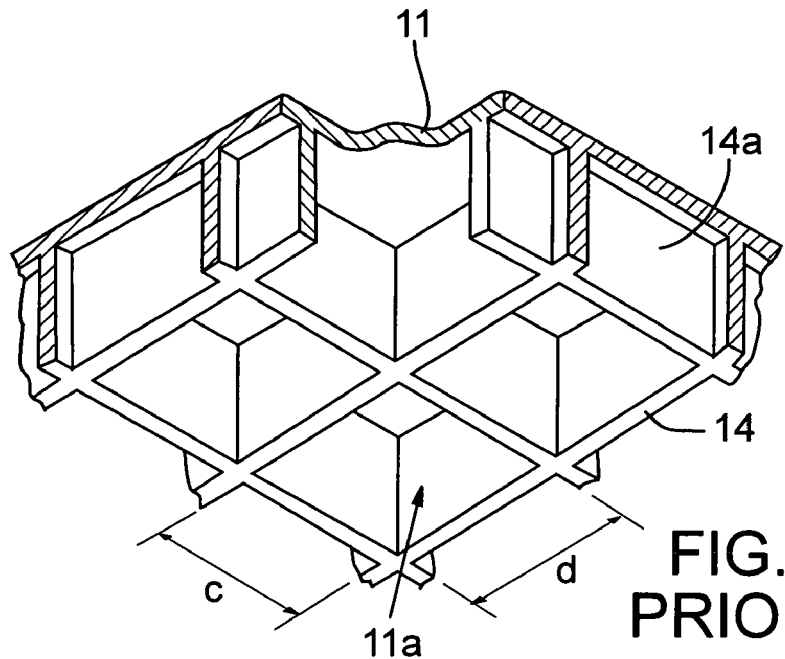
FIG. 8(C) is a schematic oblique view, from below, of a portion of a conventional segmented reticle (which can be a scattering-stencil type or scattering-membrane type, for example), showing especially the support struts and intervening subregions of the reticle.

A portion of the metal grid 26 is shown in FIG. 7. As can be seen, the grid 26 is defined by struts 24 of metal that intersect each other and thus define micro-recesses 25. The profile of the grid 26 desirably corresponds with a corresponding profile of the grid of support struts of a reticle formed thereon (see FIG. 8(C)). Specifically, as shown in FIG. 8(C), the reticle comprises support struts 14 forming a grid defining multiple subregions 11a. The grid of struts 14 desirably has the same pitch as and desirably is aligned with the grid 26 formed on the surface of the stage used to hold the reticle blank (FIG. 7). When fabricating a reticle from the reticle blank, pattern writing is performed on the respective membrane portions in each subregion 11a of the reticle blank using an electron beam. As the beam writes the respective pattern portion on each membrane portion, the electron beam passing through the respective membrane portion enters the respective micro-recess 25 of the grid 26. The respective micro-recess 25 collects the incident electrons and conducts them away rather than allowing them to backscatter and reenter the reticle blank.

For effective collection of incident electrons, each micro-recess 25 desirably has a depth that is at least 10 times the radius of a circle circumscribed by the respective opening in the grid 26. Further desirably, the grid 26 is made of a non-magnetic metal such as titanium or magnesium so as to prevent the generation of magnetic fields.

Whenever the reticle blank is placed on the metal grid 26, the struts 24 of the grid 26 desirably are aligned with the struts 14 of the reticle blank. Thus, each subregion 11a of the reticle blank is aligned with a respective micro-recess 25. As a result, electrons incident on the reticle blank for the purpose of writing the reticle pattern and that have passed through the membrane of the reticle blank reliably enter the respective micro-recess 25.

However, such strict alignment of struts is not required. This is because the area of the opening of a micro-recess 25 is much larger than the respective area of the struts in the grid 26. The collective area of the micro-recesses is 90% or more of the total area of the entire gridded structures 42. The collective area of the micro-recesses 25 preferably is 99% or more of the area of the gridded structures 42, but in any event reflects a trade off of ease of manufacturing the gridded structures 42 with performance of the same.

Furthermore, neither the subregions 11a of the reticle blank nor the micro-recesses 25 need be square in profile. Alternatively, for example, they may be rectangles or other polygonal shape such as triangles or hexagons.

As described above, apparatus and methods according to the invention achieve high-precision control of writing critical-dimension (CD) features on reticle blanks for EPL as well as for ion-beam projection lithography (IPL). The methods and apparatus also can be employed for fabricating reticles for X-ray proximity microlithography as well. The subject methods and apparatus are very effective in producing reticles exhibiting greater pattern-element and CD resolution. These reticles can be used for performing microlithography where processing dimensions are becoming progressively more minute each year, and where the MEF (Mask Error Factor) is steadily increasing without changes in reduction projection magnification. In addition, methods and apparatus according to the invention provide substantially increased contrast of resist exposures performed by microlithography. This allows microlithography to be performed reliably on sub-0.1 $\mu$m pattern elements.

Whereas the invention has been described in connection with multiple representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. An electron-beam writing apparatus for writing a pattern on a reticle blank to produce a reticle used for performing lithography, comprising:
   an electron-beam source configured to produce an electron beam that propagates downstream of the source;
   an electron-optical system situated and configured to condense and irradiate the electron beam onto a resist-covered reticle blank and to write the pattern in the resist on the reticle blank;
   a stage situated and configured to hold the reticle blank as the reticle blank is being exposed by the electron beam; and
   means for reducing backscattering of electrons, transmitted through the reticle blank, from downstream structure to the reticle blank or reducing exposure of the resist caused by the backscattered electrons.

2. The apparatus of claim 1, wherein said means comprises an electron trap situated downstream of the stage and configured to trap electrons transmitted through the reticle blank and backscattered from the downstream structure.

3. The apparatus of claim 1, wherein said means comprises an electron-absorbing plate situated downstream of the stage, the plate being made of an electron-absorbing material and having a thickness appropriate for trapping and absorbing electrons from the reticle blank that are incident on the plate.

4. The apparatus of claim 3, wherein the plate comprises a material including carbon, the material having a density of at least 1.7 g/cm$^3$, and the plate having a thickness of at least 0.1 mm.

5. The apparatus of claim 3, wherein the plate comprises a material including carbon or a material containing substantial amounts of carbon.

6. The apparatus of claim 1, wherein said means comprises a through-hole defined by a portion of the stage situated downstream of the reticle blank, the through-hole having a diameter and length sufficient to transmit electrons that have passed through the reticle blank.

7. The apparatus of claim 6, wherein said means further comprises an electron-absorbing plate situated downstream of the through-hole, the electron-absorbing plate being made of an electron-absorbing material and having a thickness appropriate for trapping and absorbing electrons from the reticle blank that are incident on the plate.

8. The apparatus of claim 1, wherein said means comprises a layer of an electrically insulative material situated downstream of the stage, the layer being configured and dimensioned to trap secondary electrons produced by electrons backscattered from downstream structure.

9. The apparatus of claim 1, wherein said means comprises at least one of the following:
   an electron trap situated downstream of the stage and configured to trap electrons transmitted through the reticle blank and backscattered from the downstream structure;
   an electron-absorbing plate situated downstream of the stage, the plate being made of an electron-absorbing material and having a thickness appropriate for trapping and absorbing electrons from the reticle blank that are incident on the plate;
   a through-hole defined by a portion of the stage situated downstream of the reticle blank, the through-hole having a diameter and length sufficient to transmit electrons that have passed through the reticle blank; and a layer of an electrically insulative material situated downstream of the stage, the layer being configured and dimensioned to trap secondary electrons produced by electrons backscattered from downstream structure.

10. The apparatus of claim 1, wherein:

the stage comprises a metal surface; and said means comprises multiple micro-recesses defined in the metal surface of the stage, the micro-recesses being divided from one another by struts and being configured to capture electrons transmitted through the reticle blank and entering the micro-recesses.

11. The apparatus of claim 10, wherein the micro-recesses collectively have an area, opening toward the reticle blank, of at least 90% of an entire gridded structure of the reticle blank.

12. The apparatus of claim 10, wherein each micro-recess has a depth that is at least 10 times a radius of a circle circumscribed by the micro-recess facing the reticle blank.

13. The apparatus of claim 10, wherein the metal surface of the stage is non-magnetic.

14. An electron-beam writing apparatus for writing a pattern on a membrane, comprising:

an electron-beam source configured to produce an electron beam that propagates downstream of the source;

an electron-optical system situated and configured to condense and irradiate the electron beam onto a resist-covered membrane and to write the pattern in the resist on the membrane;

a stage situated and configured to hold the membrane as the membrane is being exposed by the electron beam; and means for reducing backscattering of electrons, transmitted through the membrane, from downstream structure to the membrane or reducing exposure of the resist caused by the backscattered electrons.

15. The apparatus of claim 14, wherein said means comprises an electron-absorbing plate situated downstream of the stage, the plate being made of an electron-absorbing material and having a thickness appropriate for trapping and absorbing electrons from the membrane that are incident on the plate.

16. The apparatus of claim 15, wherein the plate comprises a material including carbon, the material having a density of at least 1.7 g/cm$^3$, and the plate having a thickness of at least 0.1 mm.

17. The apparatus of claim 15, wherein the plate comprises a material including carbon or a material containing substantial amounts of carbon.

* * * * *